United States Patent [19]

Wolfe

[11] 4,117,339

[45] Sep. 26, 1978

[54] DOUBLE DEFLECTION ELECTRON BEAM GENERATOR FOR EMPLOYMENT IN THE FABRICATION OF SEMICONDUCTOR AND OTHER DEVICES

[75] Inventor: John Edmond Wolfe, Escondido, Calif.

[73] Assignee: Burroughs Corporation, Detroit, Mich.

[21] Appl. No.: 812,421

[22] Filed: Jul. 1, 1977

[51] Int. Cl.$^2$ .......... H01J 37/14; 313 336;442;361;426
[52] U.S. Cl. ................................. 250/492 A; 250/398
[58] Field of Search ................... 250/492 A, 398, 396, 250/396 ML; 219/121 EB

[56] References Cited

U.S. PATENT DOCUMENTS

| 3,569,757 | 3/1971 | Brewer et al. | 250/492 A |
| 3,894,271 | 7/1975 | Pfeiffer et al. | 250/492 A |

*Primary Examiner*—Alfred E. Smith
*Assistant Examiner*—B. C. Anderson
*Attorney, Agent, or Firm*—Mervyn L. Young; Kevin R. Peterson

[57] ABSTRACT

This disclosure relates to an electron beam generator having a high brightness electron beam source and a focusing lens placed between the source and the target area to provide a large image focal distance relative to the object focal distance. In addition, two sets of deflection coils or plates are placed between the focusing means and the target where the first deflection means provides that deflection required for generation of the desired pattern and the second deflection means between the first deflection means and the target then deflects the beam back to a path normal to the target surface.

11 Claims, 7 Drawing Figures

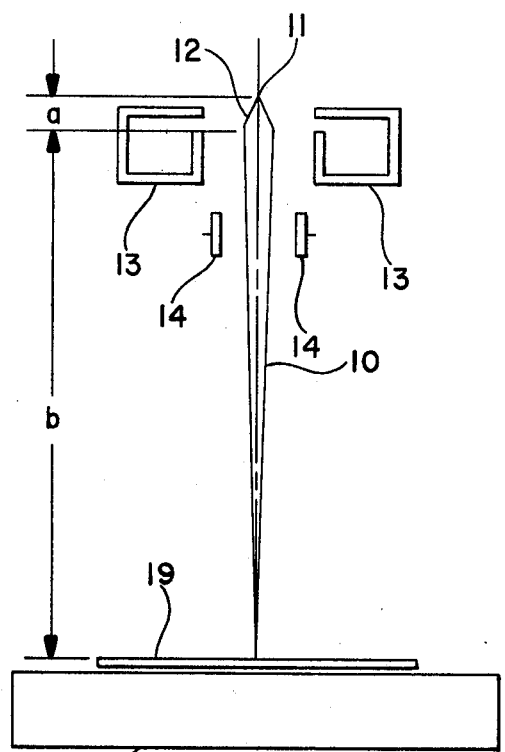
FIG. IA
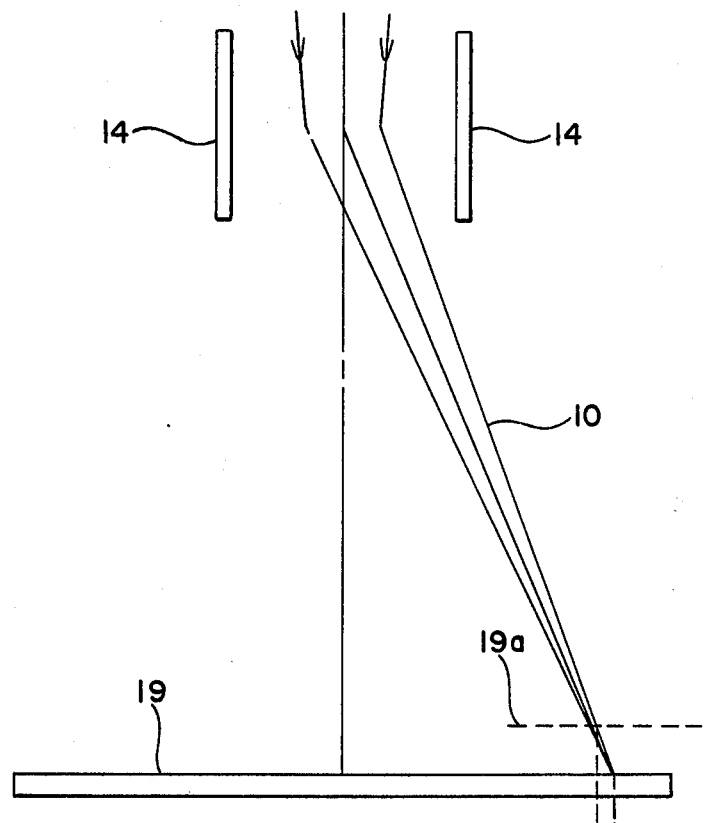
FIG. IB  →| |←— PATTERN ERROR

DOUBLE DEFLECTION ELECTRON BEAM GENERATOR FOR EMPLOYMENT IN THE FABRICATION OF SEMICONDUCTOR AND OTHER DEVICES

BACKGROUND OF THE INVENTION

1. Field of the Invention

This invention relates to an electron beam generator for employment in the fabrication of semiconductor devices and other devices. More particularly, this invention relates to such an electron beam generator which employs double deflection of the electron beam such that the beam strikes the target normal to the surface thereof.

2. Description of the Prior Art

The active elements in an integrated circuit chip are formed by a series of processes each of which, according to the prior art, require a masking step whereupon a pattern is formed on a photo-resist material by optical methods. The active elements thus formed generally are not any smaller than 2 microns in dimension and it is believed that the resolution that can be obtained by such optical lithography processes has reached its limit.

Electron beam lithography methods have been employed to achieve higher resolution but have not been greatly successful because of the time involved to generate the patterns due to the low intensity of the electron beam which requires long exposure time for the electron beam resist material employed. Another disadvantage of prior art electron beam generators is that the focusing lens was placed relatively close to the target which allowed for faster scanning of the target but only over a relatively small area. Thus, the scan cycle had to be repeated many times in order to cover a single circuit chip and even many more times to cover the entire target area.

A high current electron beam generator is disclosed in the Wolfe et al U.S. Pat. No. 3,814,975 which employs a cathode needle formed of a single crystal tungsten which needle is coated with zirconium. Other methods of applying zirconium are disclosed in the Charbonnier et al U.S. Pat. No. 3,374,386. Such an electron beam source can generate an electron beam having a current of a thousand amperes per square centimeter. With such a high current electron beam generator, the focusing mechanism can be adapted to provide a large image focal distance relative to the object focal distance such that minor angular deflection of the beam will result in relatively large scans of the target area and yet fully expose the electron beam resist materials without requiring a very slow scan.

However, even with small angular deflections, distortions appear in the pattern being generated at the target surface due to the unevenness of the target surface. Although the semiconductor wafer may be relatively flat before the process of forming the respective integrated circuits therein, the wafer will go through a number of heat cycles for the different steps required in the formation of such circuitry with a resultant warping of the surface. The resultant pattern distortions become more critical as the image spot size of the beam and the required tolerances become smaller. It is, therefore, desirable to produce a scanning electron beam which strikes the target normal to the target surface in order to minimize distortions of the generated pattern.

While the present invention is primarily adapted for employment in the fabrication of semiconductor devices, it can also be employed in the formation of other devices such as magnetic bubble memories, and any place where an electron beam lithography might be required. In addition, the present invention might be employed to form optical masks for later employment in such fabrication or may be employed to form patterns directly on the semiconductor or magnetic wafers.

It is then an object of the present invention to provide an improved electron beam generator.

It is another object of the present invention to provide an improved electron beam generator for employment in electron beam lithography.

It is still another object of the present invention to provide an improved electron beam generator which will generate an electron beam that will strike the target area normal to the surface thereof.

SUMMARY OF THE INVENTION

In order to accomplish the above-identified objects, the present invention resides in an electron beam generator having a high current electron beam source and a focusing lens placed between the source and the target area to proved a large image focal distance relative to the object focal distance. In addition, two deflection coils or plates are placed between the focusing means and the target where the first deflection means provides that deflection required for generation of the desired pattern and the second deflection means between the first deflection means and the target then deflects the beam back to a path normal to the target surface.

A feature, then, in the present invention resides in an electron beam generator having a high current electron beam source with the focusing means placed along the beam axis between the electron beam source and the target area so as to provide a large image focal distance relative to the object focal distance with two deflection means mounted between the focusing means and target area, the first deflection means being adapted to deflective electron beam as required to generate a pattern at the target surface with the second deflection means being mounted between the first deflection means and the target surface and adapted to deflect the electron beam back to a direction normal to the surface of the target area.

DESCRIPTION OF THE DRAWINGS

The above and other objects, advantages and features of the present invention will become more readily apparent from a review of the following specification when taken in conjunction with the drawings wherein:

FIGS. 1A and B are representations of a single deflection electron beam generator;

GENERAL DESCRIPTION OF THE INVENTION

Figure 2:
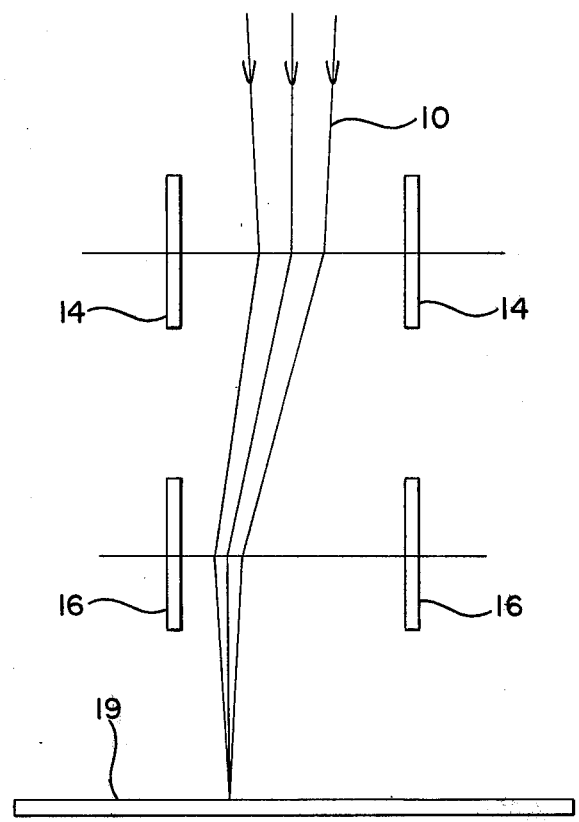
FIG. 2 is a representation of a double deflection electron beam generator of the present invention.

A general representation of an electron beam generator having a large image focal distance is illustrated in FIG. 1A. Such an electron beam generator is disclosed in detail in the Wolfe U.S. Pat. application Ser. No. 768,611 filed Feb. 14, 1977, now U.S. Pat. No. 4,084,095. The generator of FIG. 1A is formed of a thermionicfield emission source including point cathode 11 and anode 12 which accelerates electron beam 10 through a magnetic field created by magnetic lens 13 to focus the beam upon target 19. As was indicated above, target 19 may be either a sensitive mask film or a sensitized surface on an integrated circuit wafer or other devices. Deflection coils 14 are provided to deflect the focused beam to various locations on target 19. The electron beam generator of FIG. 1A is characterized by cathode 11 being capable of providing a high electron beam current and magnetic lens 13 being capable of forming a large image focal distance $b$ relative to the object focal distance $a$. In the electron beam generator of FIG. 1A, image focal distance $b$ is preferably 10 times the object focal distance $a$ and this relation is also employed in the present invention as will be described below. It is to be remembered that the purpose of the large focal distance relative to the object focal distance is to provide for the scanning of larger target areas for small angular deflections of the electron beam. This in turn is made possible by the employment of a high electron beam current cathode.

A disadvantage of a single deflection system of FIG. 1A having a large image focal distance is illustrated in FIG. 1B. In the systems of both FIGS. 1A and 1B, the electron beam scan is preferably at least ±3 millimeters at the surface of target 19 with target 19 being capable of being moved laterally by the mechanical movement of target support plate 15 of FIG. 1A. As was indicated above, the target wafer 19 will go through a number of heat cycles during the processing thereof with a resulting warping from cycle to cycle. This in turn creates the problem of aligning the different patterns that are to be generated during each one of those cycles. This is illustrated in FIG. 1B where the dotted line 19a represents the surface of a warped target. Target 19 is also shown in its ideal flat condition. Thus, it is seen that as the electron beam 10 is deflected by deflection coil 14, the pattern generated on a warped surface will differ from that generated on an ideal flat surface with resulting misalignment between the different patterns as they are generated on target 19.

The manner in which the double deflection system of the present invention overcomes the disadvantages of the single deflection system is illustrated in FIG. 2. As shown therein, the system employs two deflection coils 14 and 16 which are excited in such a manner that the angular deflection of one is cancelled by that of the second. Thus, as electron beam 10 traverses the respective deflection coils it will end up striking target 19 orthogonal to the surface thereof. Deflection coils 14 and 16 will carry the same current but with opposite polarity to achieve the desired end result.

The generator of the present invention employs a large image focal distance so as to provide long deflection distances and correspondingly small deflection angles. Deflection angles of approximately 3° or less are preferred. As was described above, in order to achieve appropriate scanning rates with such a long image focal distance, it is required to have a high current electron beam source which is capable of producing an electron beam of approximately 1,000 amperes per square centimeter.

DETAILED DESCRIPTION OF THE INVENTION

Figure 3:
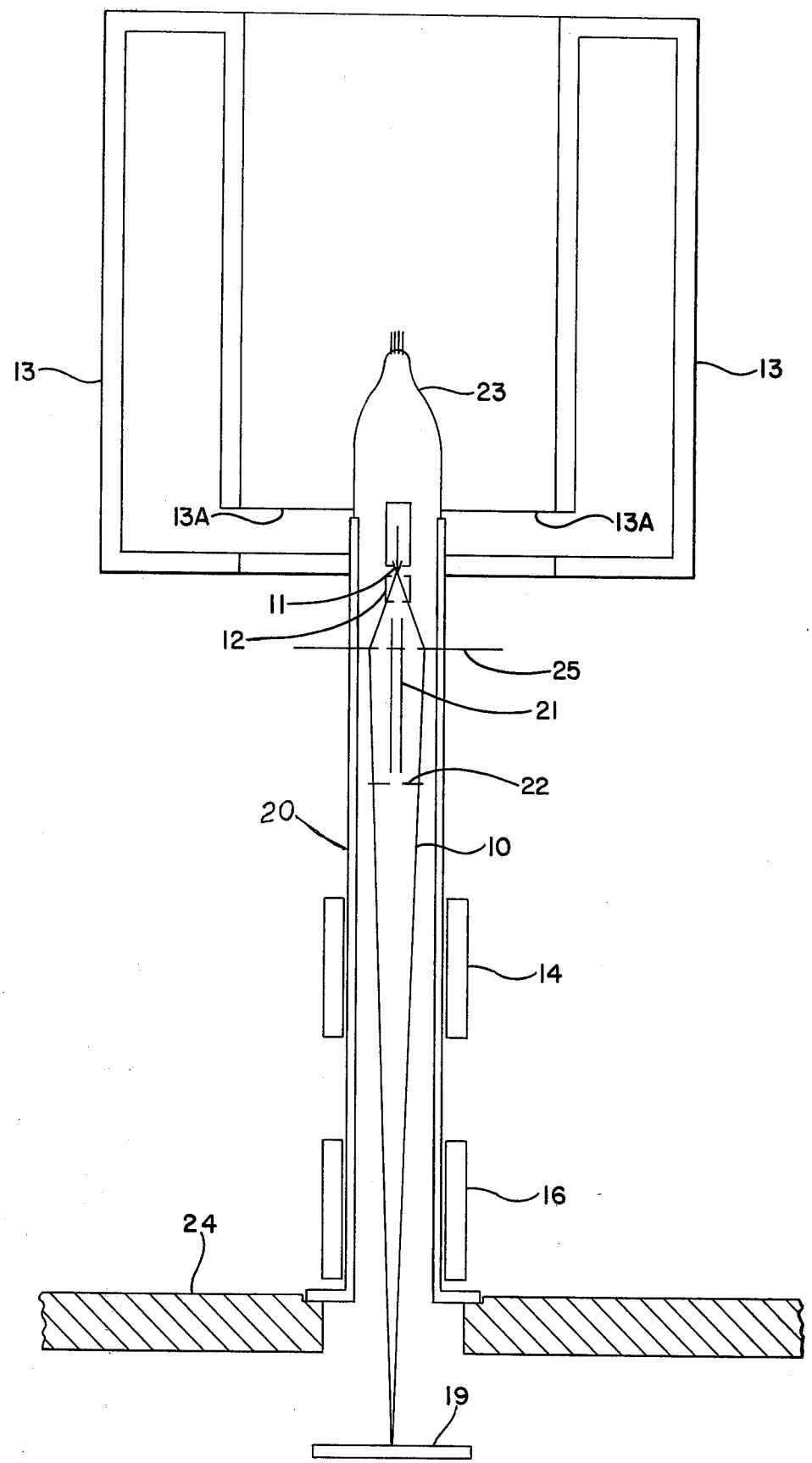
FIG. 3 is a plan view of an electron beam generator employed in the present invention.

A plan view of the double deflection system of the present invention is illustrated in FIG. 3. As shown therein, the electron beam generator is formed of column 20 in which are mounted cathode 11 and anode 12 that will be more thoroughly described below. In order to seal column 20 and maintain a vacuum, column 20 is sealed off with glass seal 23 through which the appropriate electrical connections to the electron beam source are made. Column 20 is then mounted on chamber 24 in which resides target 19 the surface of which is to be provided with the appropriate pattern. In order to provide this pattern as the electron beam scans the target, blanking plates 21 and blanking aperture 22 are provided. In order to focus the electron beam, magnetic focusing lens 13 is mounted over the top of the column in a manner that will be more thoroughly described below. Deflection coils 14 and 16 are mounted on the column 20 in order to provide the double deflection action of the present invention.

As has been indicated above, the image focal distance is preferred to be ten times as large as the object focal distance. In the embodiment of FIG. 3, the distance between the virtual object of cathode 11 and the surface of target 19 is 11 inches with the principal plane 25 of focusing coil 13 being approximately 1 inch from cathode 11 in the direction of target 19. As an example of the spacing of the deflection coils 14 and 16, deflection coil 16 is mounted with its center line 3 inches from target 19 and deflection coil 14 is mounted with its center line three inches from the center line of deflection coil 16. Envelope 10 of the electron beam represents the expanded electron beam trajectory that would exist if it were not for the limiting apertures of anode 12 and blanking aperture 22. Thus, the actual focused electron beam which strikes the target has a considerably smaller cross-section than does envelope 10 of FIG. 3.

Each of deflection coils 14 and 16 are electromagnetic to provide appropriate deflection of the electron beam. Each of coils 14 and 16 are provided with two amperes of current of either polarity to generate a magnetic field of 3 gausses of deflection flux density. As was indicated above, coil 16 will deflect in a direction opposite to the deflection provided by coil 14 so as to compensate for the angular deflection of the beam by coil 14. Each of coils 14 and 16 are actually two coils, one mounted within the other so as to provide appropriate X and Y deflection of the beam.

Figure 4B:
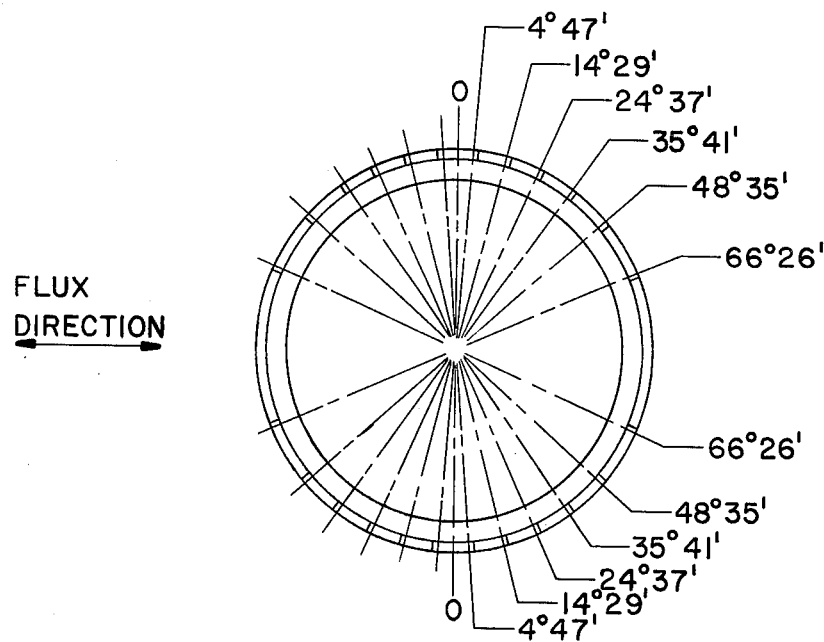
FIGS. 4A and B are plan and top views of the deflection coil as employed in the present invention.
Figure 4A:
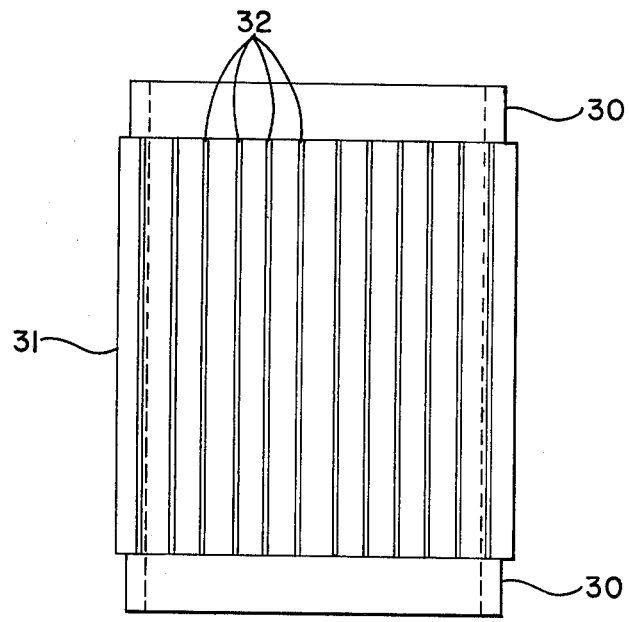

In order to provide a better understanding of the nature of the respective deflection coils and how they are wound, reference is now made to FIGS. 4A and B which are respectively a plan view and a top view of the core of each of the coils. Such a core is of a non-magnetic and non-conductive material such as a linen phenolic material and maybe fashioned out of the tube of such material. This core is provided with a hub 30 which may be machined out to leave core 31 itself in which a plurality of grooves 32 are milled. The electromagnetic coil to be supported by this core is to be wound in a cosinusoidal manner as illustrated generally in FIG. 4B so as to provide a magnetic flux in the directions to the left and right as viewed in FIG. 4B. Thus, in the center of the hub as viewed in FIG. 4A, the respective grooves 32 will be cut or milled more closely together than when they are formed at the extremities of the core as viewed in FIG. 4A. Since each of the deflection coils is to provide deflection in both the X and Y directions, two such windings are provided for each coil on two separate cores one of which is of sufficiently less diameter so as to have a slip fit with the larger of the respective cores. The direction of the cosinusoidal windings are to be oriented at 90° to one another so as to provide the appropriate X and Y beam deflection.

In the winding of the respective electromagnetic coils, the wire will be taken up one of the milled grooves then an end turn will be formed around hub 30 to that groove which is the mirror image of the first groove and then down through the mirror image groove and so forth until the complete coil has been wound. As was indicated above, a sufficient number of windings are provided so that a 2 ampere current will generate an electromagnetic field with a maximum flux density of 3 gausses. Each of the specific coils thus formed will appear to the electron beam to be a helical coil in the direction normal to that in which the electron beam is to be deflected. Such a coil is a very low inductance coil so that it may be switched very quickly.

Returning again to FIG. 3, a more detailed description will now be given of the magnetic focusing means employed in the present invention. In FIG. 3, this focusing means includes annular magnetic shell 13 having a magnetic gap 13A with electrically conductive windings (not shown) being housed within shell 13. The magnetic field which actually focuses the electron beam is created across gap 13A. To produce a long image focal distance with low aberration for a given object focal distance, the lens must have a large inside diameter. In addition, magnetic gap 13A must not be too small or excessive ampere turns will be required to generate a magnetic field of appropriate strength. In FIG. 3, the inside diameter of shell 13 is 4 inches while gap 13A is 0.5 inches in width.

The principal plane of the equivalent thin lens created by the magnetic field is approximately 1.4 inches toward the target from the center of the magnetic gap of the focusing mechanism. To achieve this, electron source 11 is positioned near the focal point with its tip approximately 0.4 inch toward the target from the center line of gap 13A. The virtual object is approximately at the tip of the electron source and 1 inch behind the principal plane with relation to the target so as to provide an object focal distance of one inch as was described above. This focusing mechanism is designed for a 1 inch object focal distance and a magnification of about 10. This requires that excitation parameter $K = 1,000$, where $K = (NI)^2/V$: $NI$ is the magnetomotive force in ampere turns and $V$ is the acceleration potential of the electron beam, which is approximately 6–10 $KV$. $K$ must be increased as the lens diameter increases to maintain sufficient magnetic field strength at the electron beam path.

Under the above circumstances, the spherical aberration coefficient $C_s$ is 0.32 inches and the chromatic aberration coefficient $C_c$ is 0.62 inches. (For the calculations of spherical aberration and chromatic aberration, see J. R. A. Cleaver, "Field Emission Guns for Electron Probe Instruments," *International Journal of Electronics,* 1975, Volume 38, Number 4, Pages 513–529. See also El-Kareh and El-Kareh, *Electron Beam Lens and Optics,* Volume 2, Academic Press, 170, Pages 58 and 270–290 respectively).

With the embodiment described in the present application, the collection half angle, $\alpha$, of the electron beam is 0.015 radians at the emitter of the electron gun as determined by an aperture such as shown in FIG. 3. This angle is defined as the angle between the beam axis and the outer ray of the beam as indicated in FIG. 3. With the above described values, the diameter of the spherical aberration disk, $d_s$, and the chromatic aberration disk diameter, $d_c$, may be calculated as $$d_s = \frac{C_s \alpha 3}{2}$$

$$d_c = \frac{C_c \Delta V \alpha}{V}$$

(See Cleaver, supra) and the values obtained thereby are $d_s = 137$ Å and $d_c = 118$ Å. The virtual crossover for this electron gun is about 100 Å. Summing these diameters in quadrature $$d = \sqrt{(118)^2 + (137)^2 + (100)^2} = 206 \text{ Å}$$

where $d$ is the virtual source size. With a magnification of 10, the image size becomes 0.206 micrometers. This value may be adjusted to larger sizes by increasing the collection half angle, $\alpha$, thereby changing $d_s$ and $d_c$ and, hence, $d$, the virtual source size.

With the embodiment of the focusing mechanism as described above, the inside diameter of the focusing mechanism is to be as large as possible without being so large as to weaken the magnetic field created by that number of ampere turns as employed in the embodiment of the magnetic coil as described. The ratio of the spherical aberration coefficient to the object focal distance, $C_s/f_o$, should be less than 0.4. The ratio of the object focal distance to the lens diameter should be less than 0.35 and, with the embodiment of the present invention, is 0.25. With the focusing mechanism as thus described, magnification of at least 10 is obtained to provide submicron spot sizes at the target as was indicated above.

Figure 5:
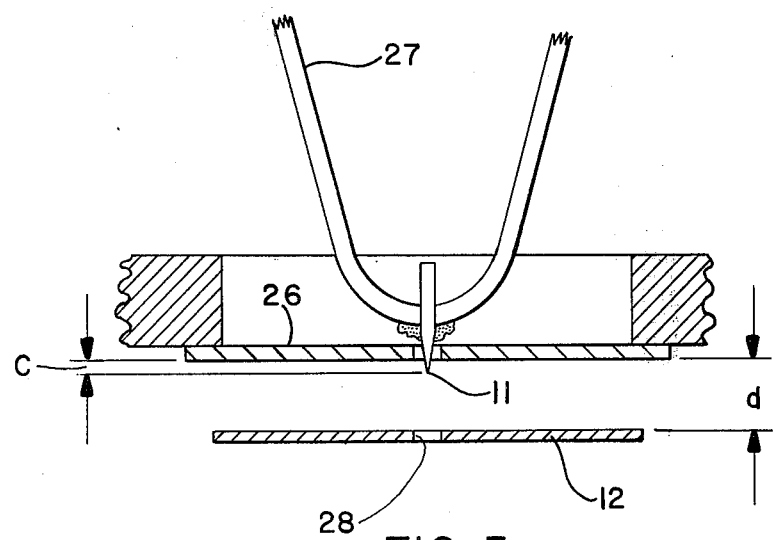
FIG. 5 is a plan view of a high current beam source as employed in the present invention.

The thermionic-field emission source employed in the present invention will now be described in relation to FIG. 5. This source includes a cathode needle 11 that is formed of single crystal tungsten with axial <100> orientation. Cathode needle 11 extends forward through grid electrode 26 which shields hairpin filament 27 to which cathode needle 11 is attached. The tip of cathode needle 11 is coated with zirconium by a manner which is described in the above referenced Wolfe et al. patent or the above referenced Charbonnier et al. patent. Anode electrode 12 is spaced from grid electrode 26 by about 30 mils and is provided with aperture 28 to allow the accelerated electron beam to pass therethrough. The voltages applied to cathode needle 11 and anode 12 are such as to create an electric field of approximately $10^7$ volts per centimeter. In operation, filament 27 is heated to a temperature of approximately 1800° K. The beam current is approximately 1 microampere for a target image of 0.25 micrometer in diameter or 1.6 microamperes for target image of 0.5 micrometer in diameter.

The cathode needle as thus described has a predicted life time of approximately 1,000 hours for the current densities employed. The cathode radius at its tip is approximately 0.6 microns to provide a virtual source which is imaged with magnification by the magnetic lens onto the target to provide about 24,000 spot diameters of deflection at the target with about 1° angular deflection. Such low angular deflections are very helpful relative to the sweep non-linearities and other aberrations.

EPILOGUE

An electron beam generator has been described for the fabrication of semiconductor and other devices having very small dimensions which generator minimizes pattern distortions due to the unevenness of the target surface on which the patterns are being generated. This is accomplished by the implementation of two electron beam deflection means, one of which compensates for the other so that the electron beam will strike the target surface normal thereto. In order to accommodate such a post dual deflection system, the electron beam generator is provided with a focusing mechanism which provides a large image focal distance relative to the object focal distance. This in turn allows for the scanning of a wider target area for small deflections of the electron beam. In order to provide for the scanning of a larger target area without increasing the time required for such a scan, the electron beam generator employs a high electron beam current source.

While but one embodiment of the present invention has been disclosed, it will be apparent to those skilled in the art that variations and modifications may be made therein without departing from the spirit and the scope of the invention as claimed.

What is claimed is:

1. A system for exposing a sensitized surface to a variable electron beam, said system comprising:
    a target positioning means to hold said sensitized surface;
    an electron beam source means to generate an electron beam along a path to said target positioning means;
    an electric potential means mounted along said path to accelerate said beam toward said target positioning means;
    a magnetic focusing means mounted along said path to provide a magnetic focusing field between said electron beam source means and said target positioning means such that the image focal distance is, quantitatively longer than the related object focal distance, said focusing means including electromagnetic means to provide sufficient magnetomotive force to focus said beam on a sensitized surface at said target positioning means;
    first deflection means mounted along said path between said magnetic focusing means and said target positioning means to deflect said electron beam from said path; and
    second deflection means mounted along said path between said first deflection means and said target positioning means to deflect said electron beam in a direction opposite from that of said first deflection means such that said redeflected electron beam is parallel to said path.

2. A system according to claim 1 wherein said first and second deflection means include electromagnetic means to provide a deflecting magnetic field equivalent to that provided by a helical coil.

3. A system according to claim 2 wherein said first and second deflection means each includes an electromagnetic coil wound on a cylindrical hub in a cosinusoidal manner.

4. A system according to claim 1 wherein said target positioning means holds a masking material having a sensitized surface.

5. A system according to claim 1 wherein said target positioning means holds a crystalline wafer having a sensitized surface.

6. A system for exposing a sensitized surface to a variable electron beam, said system comprising:
    a target positioning means to hold said sensitized surface;
    an electron beam source means to generate an electron beam along said path to said target positioning means and to provide a current density at said sensitized surface of the order of 1,000 amperes per square centimeter;
    electric potential means mounted along said path to accommodate said beam toward said target positioning means;
    magnetic focusing means mounted along said path to provide a focusing magnetic field between said electron beam source means and said target positioning means such that the image focal distance is quantitatively longer than the related object focal distance;
    first deflection means mounted along said path between said magnetic focusing means and said target positioning means to deflect said electron beam from said path; and
    second deflection means mounted along said path between said first deflection means and said target positioning means to deflect said electron beam in a direction opposite that of said first deflection means such that said redeflected electron beam is parallel to said path.

7. A system according to claim 6 wherein:
said electron beam source means includes a tungsten needle which is coated with zirconium.

8. A system according to claim 6 wherein:
said tungsten needle is formed of a single crystal tungsten.

9. A system according to claim 6 wherein:
said focusing means includes electromagnetic means such that the ratio of the square of the magnetomotive force of said electromagnetic means to the potential of said electric potential means is of sufficient magnitude to provide an image focal distance of approximately 10 times the related object focal distance.

10. A system according to claim 9 wherein:
said electromagnetic means includes an annular shell having an internal diameter sufficiently large to provide a small coefficient of spherical aberration.

11. A system according to claim 10 wherein:
the ratio of the spherical aberration coefficient to the object focal distance is less than 0.4 and the ratio of the object focal distance to the internal diameter of the electromagnetic means is less than 0.35.

* * * * *